United States Patent

Steckler

[15] 3,636,475

[45] Jan. 18, 1972

[54] OSCILLATOR WITH VARIABLE REACTIVE CURRENT FREQUENCY CONTROL

[72] Inventor: Steven Alan Steckler, Clark, N.J.

[73] Assignee: RCA Corporation

[22] Filed: Oct. 1, 1969

[21] Appl. No.: 862,705

[52] U.S. Cl. ........................................ 331/117 R, 331/177 R

[51] Int. Cl. ........................................ H03b 3/04, H03b 5/12

[58] Field of Search ........................ 331/34, 36, 117, 177, 180

[56] References Cited

UNITED STATES PATENTS 2,891,105 6/1959 Keizer ................................ 331/36 X 3,050,693 8/1962 Sinninger ........................ 331/177 UX

*Primary Examiner*—Roy Lake
*Assistant Examiner*—Siegfried H. Grimm
*Attorney*—Eugene M. Whitacre

[57] ABSTRACT

In a controlled oscillator system, current flowing in one of the reactive elements of a frequency selective network is sampled and a second reactive current having phase and frequency which corresponds to the phase and frequency of sampled reactive current is generated. A path of variable conductance is provided for the second reactive current which is in parallel relationship to the reactive element. As the conductance of the parallel path is varied in response to a control signal, the second shunt reactive current changes, producing a change in the total reactive current in the oscillator system, thereby varying the frequency of oscillation of the system.

19 Claims, 5 Drawing Figures

INVENTOR.
STEVEN A. STECKLER
BY
Eugene M. Whitacre
ATTORNEY

INVENTOR
STEVEN A. STECKLER
BY Eugene M. Whitacre
ATTORNEY

INVENTOR.
STEVEN A. STECKLER
BY
Eugene M. Whitacre
ATTORNEY

OSCILLATOR WITH VARIABLE REACTIVE CURRENT FREQUENCY CONTROL

This invention relates to oscillator circuits and specifically to oscillator circuits in which the frequency of oscillation is variable in response to a control signal such as may be utilized in the horizontal deflection oscillator of a television receiver, or in a stereo demodulator.

It is often necessary for oscillators to have output frequencies which can be varied. It is furthermore desirable in many instances to have such oscillations bear a predetermined fixed relationship to the frequency and phase of a control or reference signal. Such is the requirement of the horizontal oscillator in a television receiver, where the horizontal scanning rate derived from the oscillator must be accurately timed with the transmitted horizontal synchronization pulses for proper display of the television picture transmitted.

There exist several well-known methods of developing a control signal dependent upon the frequency differential between the oscillator to be controlled and the reference frequency. Likewise, many voltage-controlled oscillators (VCOs) exist and are widely known. Some VCOs operate in response to a change in bias level which varies the conduction point of switching devices, thereby varying the frequency of oscillation as for example in multivibrators and blocking oscillators. Sinusoidal oscillators can be controlled by placing reactive components having parameters responsive to a control signal within the frequency-determining network of the oscillator. Components such as saturable reactors or voltage-sensitive capacitors display this characteristic. Also frequently employed is the technique of sampling the voltage across the tank circuit of a sinusoidal oscillator, shifting the phase of the voltage sample using a resistive-capacitive network and employing a variable conduction device in conjunction with a control voltage to provide a variable shunting current which is approximately in quadrature phase relationship with the tank voltage and appears as a variable reactance to vary the frequency of oscillation.

The advent of monolithic circuit design techniques producing circuits popularly known as integrated circuits has required new approaches to circuit design which involve considerations entirely different than those of the discrete circuit era. The engineer fabricating integrated circuits, for example, must minimize the use of relatively large valued capacitors and resistors which either consume inordinate amounts of space on the integrated circuit chip or must be mounted external to the chip as separate discrete devices. On the other hand, he has greater flexibility in the utilization of active devices such as transistors than does the engineer using discrete components.

Prior VCO configurations utilizing discrete components have proved undesirable for integration on a monolithic chip and a new approach has been used. The present invention, although more practical in its integrated circuit embodiment, may be constructed as a discrete circuit, and is not necessarily limited to integrated circuit embodiment. The system described is direct current balanced and employs a stable sinusoidal oscillator. Also, the system incorporates stabilization of direct voltages, thereby improving drift characteristics as well as providing immunity from power supply fluctuations. Finally, temperature compensation means are employed to further stabilize operation of the oscillator system. These features obviate the need for a consumer horizontal hold control if used in a television receiver.

A circuit embodying the present invention includes oscillating means having a frequency selective network including reactive elements, means for sampling current in at least one of the reactive elements and controlling the phase and frequency of a current source coupled in parallel relationship to the reactive element to some predetermined phase relationship; and further means responsive to a control signal for varying the magnitude of current flowing in a current path including the current source that is parallel in relation to the reactive element, thereby varying the frequency of oscillation of the system.

A better understanding of the present invention and its features and objects can be obtained by referring to the drawings and description below.

Figure 1:
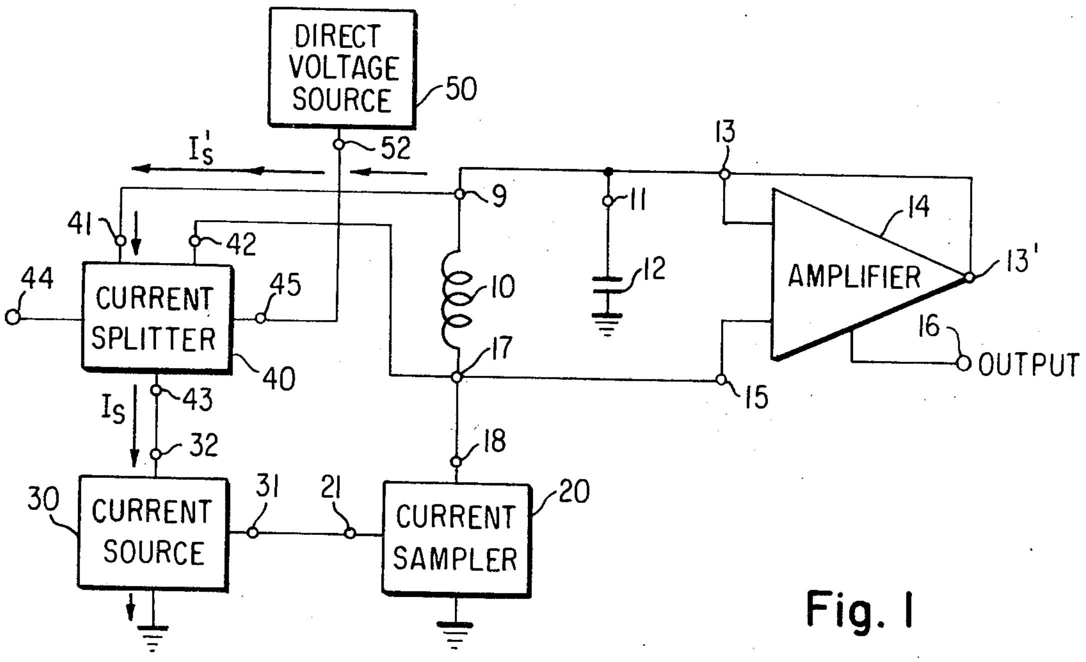
FIG. 1 illustrates in block diagram form, a voltage controlled oscillator system constructed in accordance with the present invention.
Figure 4:
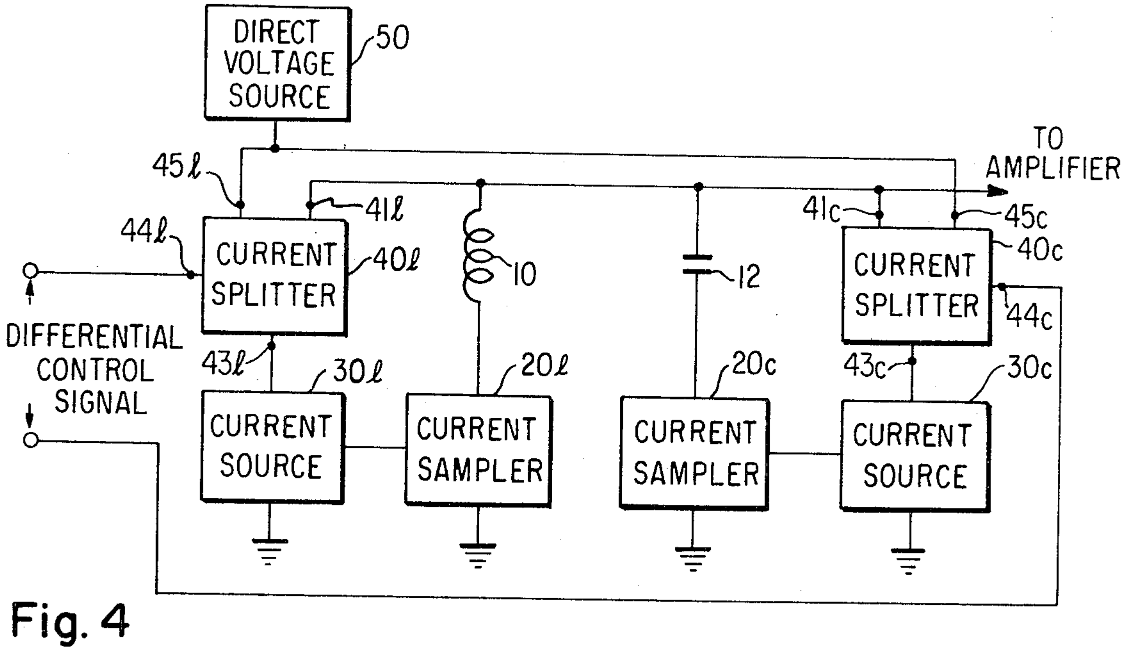
Figure 5:
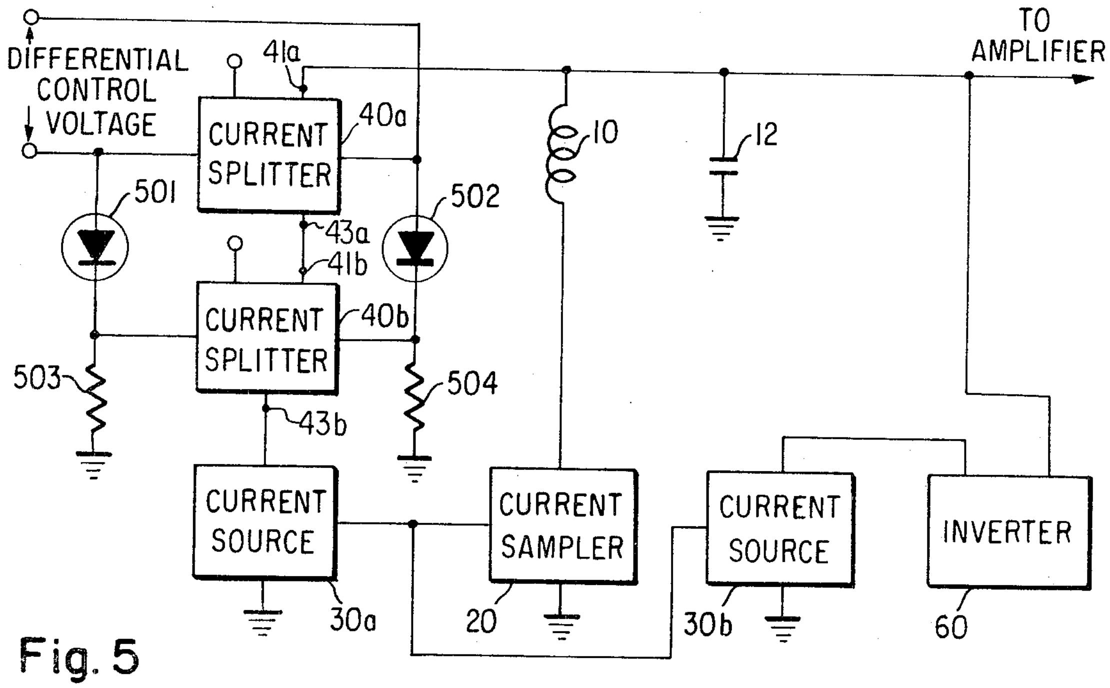

FIG. 4 illustrates in block diagram form, a modified controlled oscillator system employing the principles of the FIG. 1 embodiment for providing a pretuned system; and FIG. 5 illustrates in block diagram form a further modified controlled oscillator system employing the principles of the FIG. 1 embodiment for providing symmetrical control characteristics, and a highly sensitive control characteristic.

Referring to FIG. 1, a frequency-selective network including reactive elements illustrated by an inductor 10 and a capacitor 12 each having first terminals 9 and 11 respectively, both of which are coupled to a first input terminal 13 of an amplifier 14. The opposite terminal of capacitor 12 is coupled to a reference potential such as ground. A second terminal 17 of inductor 10 is coupled to a second input terminal 15 of amplifier 14. Amplifier 14 includes a feedback terminal 13' coupled to terminal 13 to provide a positive feedback signal necessary to sustain oscillations within the system. Amplifier 14 includes an output terminal 16 from which the desired output signal is coupled.

The second terminal 17 of inductor 10 is further coupled to an input terminal 18 of a current sampler 20. Current sampler 20 is further coupled to a reference potential such as ground. An output terminal 21 of current sampler 20 is coupled to a control terminal 31 of a current source 30. Current source 30 is also coupled to a reference potential such as ground. An output terminal 32 of current source 30 is coupled to a terminal 43 of a current splitter 40. Current splitter 40 further comprises a terminal 41 coupled to the first terminal 9 of inductor 10 and a terminal 42 coupled to the second terminal 17 of inductor 10.

Current splitter 40 further comprises a first control terminal 44 to which an external control signal is applied. A second control terminal 45 of current splitter 40 is coupled to an output terminal 52 of a direct voltage source 50.

In operation, amplifier 14, the resonant circuit comprising inductor 10 and capacitor 12, and the positive feedback path between feedback and input terminals of amplifier 14 form an oscillator having a natural frequency of oscillation determined by the parallel resonant components 10 and 12 and a reactive current flowing in a parallel reactive current path. The parallel reactive current path includes the current splitter 40 which is coupled to inductor 10. At least a portion of the alternating current flowing in inductor 10 also flows through current sampler 20. The current sampler 20 is responsive to changes in the current flowing therethrough to produce a control signal at output terminal 21. Current source 30 is responsive to this control signal to produce a second reactive current having a frequency and phase which corresponds to (i.e., which "tracks") the frequency and phase of the current flowing through inductor 10. This second reactive current, illustrated in FIG. 1 as $I_s$, flows in a current path including current source 30 and current splitter 40, at least a portion of which is in parallel relationship to inductor 10. Current splitter 40 is responsive to an external control signal applied to terminal 44 to select a portion of reactive current $I_s$ to flow in parallel with inductor 10. Thus, a change in control signal applied to terminal 44 will vary the total reactive current in parallel with the inductor 10 which has the electrical effect of varying the apparent size of the inductor 10. The frequency of oscillation is therefore dependent upon a frequency determining network including parameter values of inductor 10, capacitor 12 and the magnitude of that portion of reactive current $I_s$ which flows in the current path parallel to inductor 10. It is noted that terminal 17 of inductor 10 may in addition to being coupled to sampler 20 be coupled to terminal 42 of current splitter 40 for the purpose described in conjunction with FIG. 2 below.

In operation, direct voltage source 50 provides a direct voltage to current splitter 40 at terminal 45 which is approximately equal to the direct voltage level of the signal applied at terminal 44. When the oscillator is operating at the desired frequency in the preferred embodiment shown in FIGS. 1 and 2, the direct current biasing of splitter 40 divides current $I_s$ into approximately equal halves. One portion is illustrated as $I_s'$ and flows in shunt relation to inductor 10. The other current component (not shown) flows into terminal 42 of current splitter 40.

If the oscillator deviates from the desired frequency, the control signal applied to terminal 44 of current splitter 40 will vary the previously balanced split of current $I_s$ which flows in terminals 41 and 42 and $I_s'$ will become greater or less than one-half the value of $I_s$ to tend to return the oscillator frequency to the desired frequency.

Although a single-ended control voltage is shown, a balanced control voltage may be utilized and applied to terminals 44 and 45 of current splitter 40, thus obviating the need for source 50. Likewise, current sampler 20 can be serially coupled to capacitor 12 rather than to inductor 10 to provide a reactive current which would track current flowing in capacitor 12. In a preferred embodiment of this system, the circuitry is integrated on a monolithic semiconductor substrate, where the current sampler and source described in FIG. 2 below are electrically and thermally coupled to one another.

Figure 2:
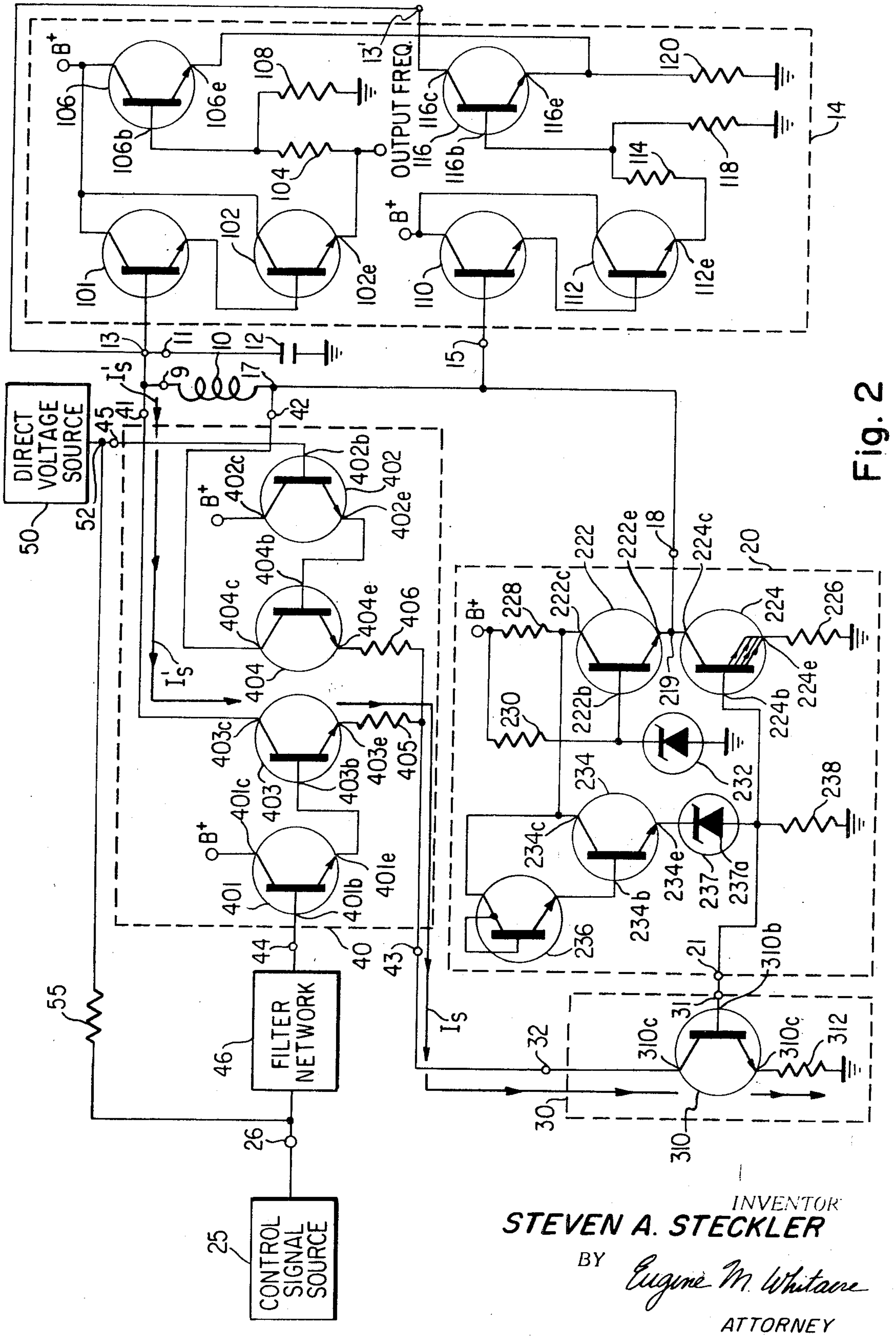
FIG. 2 is a detailed schematic diagram of the system shown in FIG. 1, wherein the functional blocks of FIG. 1 are enclosed within dashed lines. The circuitry of FIG. 2 within the dashed lines can be integrated on a single monolithic chip.

FIG. 2 shows detailed circuits within the functional blocks 14, 20, 30 and 40 described above. Amplifier 14 is a differential-type amplifier having dual input terminals 13 and 15. Input terminal 13 is coupled to cascaded emitter follower transistors 101 and 102. Output terminal 102*e* of follower 102 is coupled via a series coupling resistor 104 to a base terminal 106*b* of an emitter follower transistor 106. Base terminal 106*b* is further coupled to a reference potential such as ground through a base bias resistor 108. An output signal is extracted at the junction of emitter terminal 102*e* and resistor 104, although the output could be taken from various points on amplifier 14. Input terminal 15 is coupled to cascaded emitter follower transistors 110 and 112. An output terminal 112*e* of emitter follower 112 is coupled via a coupling resistor 114 to a base terminal 116*b* of a second output transistor 116. Base terminal 116*b* is further coupled to a reference potential such as ground through a base bias resistor 118. A collector terminal 116*c* of transistor 116 is a feedback terminal coupled to a first input terminal 13 of amplifier 14. An emitter load resistor 120 common to transistors 106 and 116 is coupled from emitter terminals 106*e* and 116*e* to a reference potential such as ground. Collector terminals 101*c*, 102*c*, 106*c*, 110*c* and 112*c* on semiconductor devices 101, 102, 106, 110 and 112, respectively, are coupled to a supply voltage indicated as B+ in the figure.

A frequency-selective network illustrated by inductor 10 and capacitor 12 is coupled to input terminal 13 of amplifier 14 by terminals 9 and 11 of each element respectively. The opposite terminal of capacitor 12 is coupled to ground. Terminal 17 of inductor 10 is coupled to input terminal 15 of amplifier 14, to input terminal 18 of current sampler 20, and to a terminal 42 of current splitter 40 as described in connection with FIG. 1 above.

Current sampler 20 has an input terminal 18 coupled to a junction 219 of an emitter terminal 222*e* of a constant current transistor 222 and a collector terminal 224*c* of a variable conduction transistor 224. Emitter terminal 224*e* of transistor 224 is coupled to a reference potential such as ground through a resistor 226. Transistor 224 may be of the multiple emitter type as indicated in FIG. 2.

Collector terminal 222*c* of transistor 222 is coupled to a power source indicated as B+ in the figure by a resistor 228. A reference direct voltage supply comprising a dropping resistor 230 and a first zener diode 232 coupled in series from a voltage supply indicated as B+ in the figure to a reference potential such as ground couples a constant voltage from the junction of resistor 230 and diode 232 to a base terminal 222*b* of constant current transistor 222. A feedback path is coupled from the collector terminal of transistor 222 to the base terminal of transistor 224. In the feedback path, a direct voltage translation transistor 234 having a diode-connected transistor 236 coupled from a collector terminal 234*c* to a base terminal 234*b* of transistor 234 and poled in the same direction as the base-emitter junction of transistor 234, has a collector terminal 234*c* coupled to the junction of resistor 228 and collector terminal 222*c* of transistor 222. Emitter terminal 234*e* of transistor 234 is coupled to a second zener diode 237. Diode 237 is poled to operate in the zener mode in response to emitter current flowing through transistor 234. An anode terminal 237*a* of diode 237 is coupled to a base terminal 224*b* of transistor 224, to an output terminal 21 of current sampler 20 and to a reference potential such as ground through a resistor 238.

Output terminal 21 of current sampler 20 is coupled to a control terminal 31 of current source 30. Current source 30 comprises a source transistor 310 having base, collector and emitter terminals 310*b*, 310*c*, and 310*e* respectively. Emitter terminal 310*e* is coupled through a resistor 312 to a reference potential such as ground. Base terminal 310*b* is coupled to control terminal 31. In the preferred embodiment, transistor 310 is thermally coupled to transistor 224. Transistor 310 may be of the multiple emitter type in some applications. Collector terminal 310*c* is coupled to an output terminal 32 which is further coupled to a current terminal 43 of current splitter 40.

Current splitter 40 comprises emitter followers 401 and 402 having emitters 401*e* and 402*e* coupled to base terminals 403*b* and 404*b* of transistors 403 and 404 respectively. Emitter terminal 403*e* of transistor 403 is coupled to emitter terminal 404*e* of transistor 404 by means of serially coupled resistors 405 and 406. The junction of resistors 405 and 406 is coupled to the current terminal 43 of current splitter 40.

Collector terminals 401*c* and 402*c* of emitter followers 401 and 402 respectively are coupled to a power source indicated as B+ in the figure. Collector terminal 403*c* of transistor 403 is coupled to a first current terminal 41 of the current splitter 40. A collector terminal 404*c* of transistor 404 is coupled to a second current terminal 42 of current splitter 40. A base terminal 401*b* of emitter follower 401 is coupled to a first control terminal 44 of current splitter 40. The control terminal 44 is further coupled through a filter network 46 having direct current transmission characteristics, to an input terminal 26 to which an external control signal is applied. The external control signal is developed by a source 25 which may comprise, for example, a conventional automatic frequency control circuit in a television receiver which compares the phase of the horizontal flyback pulses with incoming horizontal synchronization pulses. Source 25 develops a signal of a first polarity when the oscillator frequency represented by the flyback pulses is below the synchronization pulse frequency or the flyback pulses lead the sync pulses in phase, and a second polarity when the frequency or phase deviation is in the opposite direction. A base terminal 402*b* of emitter follower 402 is coupled to a second control terminal 45 of current splitter 40. The second control terminal 45 is further coupled to an output terminal 52 of a direct voltage source 50. The output terminal 52 of voltage source 50 is further coupled to input terminal 26 by means of resistor 55.

The above-described system operates in the following manner. Sinusoidal oscillations are generated and sustained in the frequency-determining network including inductor 10 and capacitor 12 by coupling an alternating oscillatory voltage developed across the network 10, 12 to input terminal 13 of amplifier 14, amplifying this voltage, and feeding back, by means of the coupling between terminals 13 and 13', an alternating voltage which sustains the oscillatory voltage developed across the network 10, 12. It may be noted here that terminals 17 and 15 are essentially at ground potential for alternating current frequencies by virtue of the low-impedance connection through the current sampler 20. Amplifier 14 includes emitter followers 101, 102, 110 and 112 which presents a relatively high impedance to the frequence-selective network to prevent excessive loading. Voltage applied to terminal 13 of amplifier 14 is coupled to base terminal 106*b* of emitter follower 106 through emitter followers 101 and 102 and the divider network comprising resistors 104 and 108. Emitter current flowing from emitter terminal 106*e* of transistor 106 develops a voltage across resistance 120 which is in phase with the input voltage at terminal 13. Base terminal 116*b* of second output transistor 116 is maintained at a relatively fixed direct voltage level determined principally by biasing resistors 114 and 118.

Since resistor 120 is common to emitters 106*e* and 116*e* of emitter follower transistor 106 and emitter follower transistor 116 respectively, and base 116*b* is at a fixed voltage, the voltage developed across resistor 120 by emitter current flowing from emitter 106*e* of transistor 106 serves to drive transistor 116, thereby developing a collector current at terminal 116*c* which is in phase with the incoming voltage at terminal 13′ and is applied to terminal 13 to provide the necessary feedback signal to sustain oscillations in the system. It is seen that transistors 106 and 116 are coupled together in a differential amplifier configuration. Resistors 104 and 108 associated with emitter follower 106 serve to bias the follower at a direct voltage level equal to the bias level of transistor 116 which is determined by resistors 114 and 118. The magnitudes of these resistors are chosen to prevent transistor 116 from saturating during operation. The output signal is taken from the junction of terminal 102*e* on emitter follower 102 and resistor 104 but could be taken from various other locations such as across a resistor coupled between B+ and the collector terminal of transistor 106.

Having described the basic oscillator circuit, a description of the means for varying the frequency of oscillation follows. Current flowing in inductor 10 is out of phase with the voltage across the inductor 10 and will be referred to as reactive current. The reactive current of inductor 10 flows in part in the series path including current sampler 20. Current sampler 20 operates with current source 30 to generate a second reactive current or current sample designated as $I_s$ which tracks the phase and frequency of reactive current flowing in inductor 10. The emitter area ratios of transistors 224 and 310 can be varied to provide a current $I_s$ which bears the required magnitude relation to the sampled current flowing in the collector of transistor 224.

Defining current flowing from terminal 9 to terminal 17 within inductor 10 as positive and current flowing from terminal 17 to terminal 9 within inductor 10 as negative, it can be seen that positive reactive current flowing in inductor 10 is in the forward conduction direction for transistor 224 in sampler 20 and negative current flowing in inductor 10 is in the forward conduction direction for transistor 222 in current sampler 20. Current in transistor 222, however, is maintained at a constant value by the negative feedback path between collector terminal 222*c* of transistor 222 and base terminal 224*b* of transistor 224, and by the application of a constant direct voltage to base terminal 222*b* by the voltage source comprising resistor 230 and voltage regulating means such as zener diode 232. The negative feedback path includes transistor 234, diode 236, zener diode 237 and resistor 238. Resistors 228 and 238 bias diode 237 in the zener operating mode. Diodes 234, 236 and 237, and transistor 234 provide temperature compensation for resistor 228, to aid in maintaining the current in transistor 222 constant and stabilize the operating point for ambient temperature variations.

In operation, if the current at terminal 18 increases in the negative direction, and if, therefore, collector current in transistor 222 momentarily tends to increase, the voltage at collector 222*c* will tend to decrease due to the increased voltage drop across collector resistor 228. This decrease in voltage is coupled to base terminal 224*b* of lower transistor 224 by means of the feedback path and tends to decrease the conductance of lower transistor 224 which in turn compensates for the increase in current at terminal 18 and precludes the increase in collector current in upper transistor 222. If the current at terminal 18 decreases in the negative direction, and if, therefore, collector current in upper transistor 222 momentarily tends to decrease, the opposite effect occurs which again opposes the change in current in transistor 222.

It is this negative feedback feature of the sampler which makes it effectively a low impedance coupled to inductor 10. Since collector current in transistor 222 is relatively constant, it is apparent that nearly all of the current variations occurring in inductor 10 are reflected as increases or decreases in collector current in transistor 224. The finite loop gain of sampler 20 may, however, allow some small current modulation in transistor 222. The actual current division at point 18 is a function of this loop gain.

Current source 30, including transistor 310, is coupled to the base terminal 224*b* of transistor 224 by means of base terminal 310*b* and an interconnection of terminals 31 and 21. Resistors 312 and 226 associated with transistors 310 and 224 respectively are chosen to produce emitter voltages in the transistors 310 and 224 which are at a predetermined relationship. Further, the transistors are thermally coupled, for example, in the preferred embodiment, by placing them adjacently on an integrated monolithic circuit substrate. Therefore, the phase and frequency of collector current flowing in transistor 310 tracks (corresponds to the phase and frequency of) collector current in transistor 224, while the magnitude of collector current in transistor 310 has a fixed relationship to the magnitude of collector current flowing in transistor 224 in proportion to the relative base-emitter areas of transistors 310 and 224 and emitter resistors 312 and 226.

In one embodiment, the collector current of transistor 310 is one-fourth the collector current flowing in transistor 224, since the base-emitter area of transistor 310 is one-fourth that of transistor 224 as indicated in the drawing by a quadruple emitter schematic symbol for transistor 224. The ratio between the collector current of transistors 310 and 224 determines the frequency range over which the oscillator may be tuned. The four-to-one relationship is suitable when the oscillator is used in the horizontal deflection system of a television receiver. It is noted that this ratio will vary as the relative base-emitter areas and need not be an integer relationship.

Thus, by sampling a portion of the current actually flowing in inductor 10, the current sampler 20 and current source 30 combine to generate a reactive current sample indicated as $I_s$ which tracks the phase and frequency of the reactive current in inductor 10. This current sample is coupled to a current splitter 40 which completes a current path in parallel relation with the inductor 10. A portion of this reactive current sample will be referred to as shunt current and is indicated by the symbol $I_s'$ in the figure.

Current splitter 40 provides the means for varying the magnitude of the portion of reactive current ($I_s$) flowing in parallel relationship with inductor 10. Splitter 40 includes a differentially coupled pair of transistors, first transistor 403 and second transistor 404. Since $I_s$ is of the same phase as current flowing in inductor 10, the effect of providing a path in parallel with inductor 10 for a portion of the current $I_s$ is to provide an apparent inductor in parallel relationship with inductor 10 which changes value in response to an externally applied control signal, thereby varying the frequency of oscillation of the system. In current splitter 40, transistor 403 and resistor 405 complete the parallel current path from terminal 9 of inductor 10 to the current source 30. An external control voltage is applied to terminal 26, filtered by a relatively long time constant network 46 and applied to the base terminal 401*b* of emitter follower 401. Emitter follower 401 serves to prevent loading of the filter. Follower 401 applies the control voltage to base terminal 403b, thereby changing the conductance of transistor 403 with changes in control signal. In the preferred embodiment, $I_s'$ comprises one-half the total current $I_s$ flowing through current source 30 when the oscillator is operating at the desired frequency (for example, 15,734 Hertz in a horizontal oscillator of a color television receiver).

The remaining current flowing in current source 30 ($I_s$–$I_s'$) is conducted by transistor 404 which has collector terminal 404c coupled to terminal 17 of inductor 10. This connection is desirable to maintain the direct current operating point of transistor 224 in current sampler 20 constant. Emitter resistors 405 and 406 associated with transistors 403 and 404 are provided to establish the necessary sensitivity of the current splitter to provide linear operation within the range of control signals applied. Constant voltage source 50 produces a bias voltage for transistor 404 and is applied to base terminal 404b by means of emitter follower 402 which performs the same function as emitter follower 401. Resistance 55 couples the output of source 50 to input terminal 26 to provide a control voltage in the absence of a control signal. This will maintain the oscillator system at the desired nominal frequency in the event of loss of the control voltage as may occur if synchronization signals are absent when the system is utilized as the horizontal oscillator in a television receiver. This result is obtained sequence the current splitter is balanced. Resistor 55 is sufficiently large not to affect normal operation when a control signal is present. It is noted that a positive going control voltage will increase the value of $I_s'$, thereby increasing the frequency of oscillation of the system.

Figure 3:
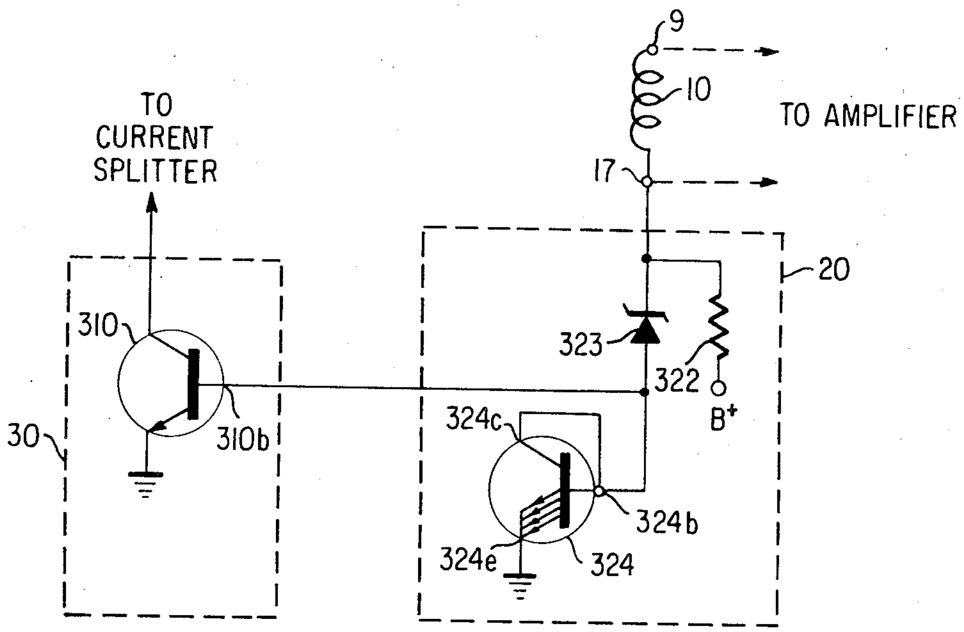
FIG. 3 is a schematic diagram of an alternate circuit which can be used as the current-sampling means in FIG. 1.

Although the preferred embodiment is especially suited to be integrated on a monolithic semiconductor substrate, the invention is not necessarily limited thereto. Other means for varying the magnitude of the portion $I_s'$ of the current $I_s$ may also be substituted for the current splitter. A system utilizing the present invention may display negative rather than positive control characteristics. Further, other methods of current sampling can be employed to produce a current $I_s$. FIG. 3, for example, illustrates such a circuit.

In the figure, current flowing through inductor 10 flows in the serially coupled path including diode 323 and transistor 324. Resistor 322 is coupled from the junction of inductor 10 and diode 323 to the supply voltage illustrated as B+ in the figure. Resistor 322 serves to provide a bias voltage for diode 323 and transistor 324 and presents a high impedance to prevent shunting of sampled current. Diode 323 couples current from inductor 10 to transistor 324. Transistor 324 has a base terminal 324b coupled to a collector terminal 324c. A current source 30 includes a transistor 310 having a base terminal 310b coupled to the base terminal 324b of transistor 324 in current sampler 20. Transistors 324 and 310 have proportional conduction, since the base and the emitters 310b, 324b and 310e and 324e are at the same potential and with transistor 310 thermally coupled to transistor 324 (e.g., on the same integrated circuit), collector current flowing in transistor 310 will track current flowing in transistor 324 and the magnitude of current will relate to the ratios of the base-emitter areas of the respective transistors. Thus, as before, current source 30 generates a current $I_s$ which tracks the current flowing in inductor 10.

Control characteristics of the system can be altered by, for example, sampling current in both inductor 10 and capacitor 12. An example of such a configuration is shown in block diagram form in FIG. 4. This system, unlike that of FIG. 1, will display a center frequency dependent only upon the parameter values of inductor 10 and capacitor 12 if the inductive sample and capacitive sample are equal. Thus, it can be pretuned.

In the figure, the functional blocks 14, 20*l*, 20*c*, 30*l*, 30*c*, 40*l* and 40*c* can comprise the same circuit configurations as the corresponding blocks 14, 20, 30, 40 described in connection with FIG. 2. A differential control signal can be applied as indicated to the current splitters 40*l* and 40*c* to provide frequency control. The primary difference in the operation of this system as compared with the system described in FIG. 2 is the addition of a further parallel current path for reactive current corresponding to that of capacitor 12. Thus, the currents flowing in each of reactive elements 10 and 12 are sampled and the shunt currents generated are varied to control the frequency of oscillation of the system.

A system having symmetrical control characteristics can be designed with high control sensitivity and an oscillating frequency range extending to very low values approaching zero frequency is illustrated in FIG. 5. Again, functional blocks 14, 20, 30a, 30b, 40a and 40b can be identical to those shown in FIG. 2. The operation of these blocks is the same as explained in the description of the FIG. 2 circuits. An inverter 60 is coupled in circuit with current source 30b and operates in a conventional manner to invert the phase of current flowing in current source 30b. Diodes 501 and 502 and resistors 503 and 504 associated with current splitter 40a and current splitter 40b provide the required operating bias points for the splitters 40a and 40b. The advantage of the system shown in FIG. 5 can be explained as follows. When a single current splitter is employed, the second reactive current or current sample flowing in the parallel current path including the splitter is linearly related to the control signal. Since the frequency of oscillation of the system is related to the reactive current as a square root function, the frequency of the system will vary as a function of the square root of the control signal. When serially coupled current splitters are employed, however, as indicated in FIG. 5 by splitters 40a and 40b, the shunt current flowing in parallel relationship to the reactive element has a second order relationship to the applied control signal. The frequency is therefore linearly related to the control signal. It is noted that in the circuit of FIG. 5 current sources 30a and 30b are coupled in parallel to and are driven by a single current sampler 20. The current flowing through inverter 60 tracks the phase of the current flowing through inductor 10 at some predetermined phase relationship. If it is 180° out of phase with inductor 10 current, it effectively acts to cancel the inductive current and the frequency of oscillation will be determined by the magnitude of shunt current flowing in the parallel current path including splitters 40a and 40b and current source 30a.

In the schematic diagram shown in FIG. 2, the following parameter values have been utilized:

| | | |
|---|---|---|
| Capacitor | 12 | 0.005 microfarads |
| Inductor | 10 | 25 millihenry |
| Resistors | 55 | 150,000 ohms |
| | 104 | 3,000 ohms |
| | 108 | 1,000 ohms |
| | 114 | 3,000 ohms |
| | 118 | 1,000 ohms |
| | 120 | 2,000 ohms |
| | 226 | 130 ohms |
| | 228 | 1,300 ohms |
| | 230 | 20,000 ohms |
| | 238 | 3,000 ohms |
| | 312 | 520 ohms |
| | 405 | 240 ohms |
| | 406 | 240 ohms |

The resistors and semiconductor devices have been integrated on a semiconductor monolithic substrate. The B+ potential utilized is approximately 10.5 direct volts.

What is claimed is:

1. A controlled oscillator system comprising:

oscillator means including a frequency-selective network having at least one reactive circuit element for producing an oscillator output signal at a frequency determined at least in part by said network;

current-sampling means coupled in series relation with said reactive element of said oscillator means for providing a current sample having a phase and frequency determined by current in said reactive element; and control means coupled in parallel relationship with said reactive element and to said current-sampling means for varying current flowing in parallel with said reactive element and thereby varying the phase or frequency of oscillation of said controlled oscillator system.

2. A controlled oscillator system in accordance with claim 1 wherein:

said control means comprises voltage-responsive conductive means for varying the amount of current responsive to said current sample which flows in parallel with said reactive element.

3. A controlled oscillator system comprising:

oscillator means including a frequency-selective network having at least one reactive circuit element for producing an oscillator output signal at a frequency determined at least in part by said network;

means coupled to said oscillator means for providing a current sample corresponding in phase and frequency to current in said reactive element; and control means comprising a pair of current paths coupled in series with and responsive to said current sample, one of said current paths being coupled in parallel relationship with said reactive element, and voltage-responsive conductive means for controlling the conductivity of said pair of current paths, thereby varying the amount of current which flows in parallel with said reactive element to control the frequency or phase of oscillation of said controlled oscillator system.

4. A controlled oscillator system comprising:

oscillator means including a frequency-selective network having at least one reactive circuit element for producing an oscillator output signal at a frequency determined at least in part by said network;

means coupled to said oscillator means for providing a current sample corresponding in phase and frequency to current in said reactive element including a current source; and control means coupled to said current source and responsive to said current sample for completing a current path in parallel relation with said reactive element for varying the phase or frequency of oscillations of said controlled oscillator system.

5. A system as defined in claim 4 and further including:

means for controlling current flowing in said current source to synchronize the phase and frequency of said current with current flowing in said reactive element.

6. A controlled oscillator system in accordance with claim 1 and further comprising:

means for coupling a control signal to said control means, said control signal being representative of phase or frequency errors in said oscillator for producing a phase or frequency change in said oscillator output frequency to correct for said phase or frequency error.

7. Frequency controlling circuit means comprising:

a circuit including a reactive circuit element, current-sampling means coupled in series relation with said reactive element for providing a current sample corresponding in phase and frequency to current in said reactive element, a current path of controllable conductivity connected in parallel with said reactive circuit element, current-sampling means coupled in series relation with said reactive circuit element and to said controllable conductivity current path for causing the current in said current path to change in synchronism with changes in phase and frequency of current through said reactive element, and control means coupled to said current path for varying current in said path in response to signals supplied to said control means.

8. A controlled oscillator system comprising:

an amplifier having a frequency-selective network including at least one reactive circuit element and a regenerative feedback circuit to sustain oscillations;

a current source coupled to said frequency-selective network and responsive to current flowing in said reactive element of said frequency-selective network for providing a reactive current, said reactive current being controlled in phase and frequency by current flowing through said reactive element of said frequency-selective network;

means for providing a conduction path for said reactive current in parallel relation to said reactive element of said frequency-selective network; and means coupled to said means for providing a conduction path and responsive to an externally applied control signal to vary the magnitude of current flowing through said conduction path, thereby varying frequency of oscillation of said system.

9. A controlled oscillator system as defined in claim 8 including current-sampling means coupled in series relation to said reactive circuit element, said current-sampling means further coupled to said current source to control the phase and frequency of current flowing therethrough.

10. A frequency-controlled oscillator system comprising in combination:

an oscillator circuit including a frequency selective network comprising at least one reactive element, means for providing a current sample of current flowing in said reactive element, said means including a current source comprising at least one transistor having base, emitter and collector terminals, and means coupled to said collector terminal of said current source transistor and responsive to external control signals for providing a variable conduction current path in parallel relation with said reactive element.

11. A circuit as defined in claim 10 wherein said means for providing a current sample further includes:

means for developing a control signal to be applied to said base terminal of said current source transistor, said last-named means coupled to at least said one reactive element of said frequency-selective network to produce a control signal responsive to current flowing in said reactive element to drive said current source in synchronism with said current flowing in said reactive element.

12. A circuit as defined in claim 11 wherein said means for developing a control signal includes:

a variable conduction transistor having a base terminal coupled to said base terminal of said current source transistor, and a collector terminal coupled to said reactive element, and a constant current transistor having base, emitter and collector terminals, said emitter terminal coupled to said collector terminal on said variable conduction transistor, said collector terminal coupled to a power source and said base terminal coupled to a reference potential.

13. A circuit as defined in claim 10 wherein said means for providing a current path of variable conduction comprises:

a first transistor of a pair of differentially coupled transistors, said first transistor having a base terminal coupled to an externally applied control signal, an emitter terminal coupled to said current source, and a collector terminal coupled to a first terminal on said reactive element of said frequency-selective network; and a second transistor of said pair having a base terminal coupled to a direct voltage source, an emitter terminal coupled to said emitter terminal of said first transistor of said pair, and a collector terminal coupled to a second terminal on said reactive element whereby the total current flowing in said current source is divided between said first and second transistor in differing amounts in response to changes in said externally applied control signal thereby varying the frequency of oscillation of said system.

14. A controlled oscillator system comprising:

an amplifier having first and second input terminals, a feedback terminal, and an output terminal;

capacitive means coupled from said first input terminal of said amplifier to a reference potential;

inductive means having a first and second terminal, said first terminal being coupled to said first input terminal of said amplifier;

means for coupling said feedback terminal to said first input terminal of said amplifier, thereby providing regenerative feedback to sustain oscillations in said system;

means for coupling said second terminal of said inductive means to said second input terminal of said amplifier;

current-sampling means having input and output terminals, said last-named input terminal being coupled to said second terminal of said inductive means, said current-sampling means being responsive to current flowing in said inductive means to produce a current control signal;

a reactive current source having output and control terminals, said control terminal being coupled to said output terminal on said current-sampling means, said reactive current source responsive to said current control signal to supply current from said source, whereby said current is in predetermined phase relationship to current flowing in said inductive means; and current-splitting means coupled to said current source for conducting at least a portion of said current flowing in said current source in a parallel path to said inductive means, said current splitting means being responsive to an externally applied control signal to vary the magnitude of current flowing in said parallel path, thereby varying the frequency of oscillation of said system.

15. A controlled oscillator system as defined in claim 14 wherein said current-sampling means includes a variable conduction transistor coupled in series relation with said inductive means to conduct at least a portion of reactive current flowing therethrough.

16. A controlled oscillator system as defined in claim 14 wherein said reactive current source comprises:

a current source transistor having a base terminal coupled to said current-sampling means, and a collector terminal coupled to said current-splitting means to provide in part a current path parallel in relation to said inductive means said current source responsive to signals from said current-sampling means to develop a reactive current sample which is in phase and frequency synchronization with current flowing in said inductive means.

17. A circuit as defined in claim 16 wherein said current-sampling means comprises a variable conduction transistor coupled in series relation with said inductive means to conduct at least a portion of reactive current flowing therethrough, said current source transistor is constructed in proximity to said variable conduction transistor on a monolithic integrated circuit substrate thereby being thermally coupled thereto, and said current source transistor includes a base-emitter junction area bearing a proportional relationship to the base-emitter area of said variable conduction transistor.

18. A circuit as defined in claim 14 wherein said current-splitting means comprise:

a first transistor having base, collector and emitter terminals wherein said emitter terminal is coupled to said current source, said base terminal is coupled to a source of external control signals, and said collector terminal is coupled to said first terminal of said inductive means and a second transistor having base, collector and emitter terminals wherein said emitter terminal is coupled to said current source, said base terminal is coupled to a direct voltage source and said collector terminal is coupled to a second terminal of said inductive means.

19. A circuit as defined in claim 18 wherein said first and second transistors share the total current flowing in said current source in a proportion determined by said external control signal applied to said base terminal of said first transistor, and wherein said collector current in said first transistor is in parallel relation with current in said inductive means thereby effecting a change in frequency of operation of said system with changes in said collector current in response to said external control signal.

* * * * *